(12) United States Patent
Liu et al.

(10) Patent No.: US 6,939,752 B1
(45) Date of Patent: Sep. 6, 2005

(54) APPARATUS AND METHODS FOR INTEGRATED CIRCUIT WITH DEVICES WITH BODY CONTACT AND DEVICES WITH ELECTROSTATIC DISCHARGE PROTECTION

(75) Inventors: Yowjuang W. Liu, San Jose, CA (US); Minchang Liang, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 5 days.

(21) Appl. No.: 10/646,490

(22) Filed: Aug. 22, 2003

(51) Int. Cl.[7] .............................................. H01L 21/00
(52) U.S. Cl. ...................................... 438/151; 257/347
(58) Field of Search ............................ 438/149, 151, 438/311; 257/347

(56) References Cited

U.S. PATENT DOCUMENTS 6,537,861 B1 * 3/2003 Kroell et al. ............... 438/149
6,638,799 B2 * 10/2003 Kotani ....................... 438/154
6,867,083 B2 * 3/2005 Imam et al. ................ 438/212

* cited by examiner

*Primary Examiner*—David Nelms
*Assistant Examiner*—Quoc Hoang
(74) *Attorney, Agent, or Firm*—O'Keefe, Egan & Peterman, LLP

(57) ABSTRACT

An integrated circuit (IC) includes one or more silicon-on-insulator (SOI) transistors. Each SOI transistor includes a first source region, a second source region, a drain region, a body contact region, a gate, and first and second isolation regions. The body contact region couples electrically to a body of the SOI transistor. The gate controls current flow between the first and second source regions and a drain region of the transistor. The first isolation region is disposed between the first source region and the body contact region. The second isolation region is disposed between the second source region and the body contact region.

25 Claims, 14 Drawing Sheets

APPARATUS AND METHODS FOR INTEGRATED CIRCUIT WITH DEVICES WITH BODY CONTACT AND DEVICES WITH ELECTROSTATIC DISCHARGE PROTECTION

TECHNICAL FIELD

The inventive concepts relate generally to integrated circuits (ICs) and, more particularly, to integrated circuits that include: (i) a body contact for at least one silicon-on-insulator (SOI) transistor in the IC; and (ii) an electrostatic discharge (ESD) protection circuitry for at least one transistor or circuit in the IC.

BACKGROUND

Since its inception, SOI technology has gained popularity with IC designers, even though SOI is relatively new. The popularity of SOI technology results form its superior performance characteristics, such as its relatively high speeds of operation. Unfortunately, conventional SOI technology and ICs that include SOI circuitry suffer from several disadvantages.

First, such ICs fail to include an efficient way of providing a body contact for one or more SOI transistors in the IC. Transistors with conventional body contacts suffer from either relatively large size or lack of flexibility (e.g., they have a particular topology that the designer may not readily change).

Second, ICs with conventional SOI technology lack reliable, efficient ESD protection circuitry. Existing ESD protection circuitry either consume relatively large areas within the IC or suffer from reliability problems, such as electromigration.

A need therefore exists for compact, efficient body contacts for SOI transistors. Furthermore, a need exists in the art for area-efficient, reliable ESD protection mechanism for ICs that include SOI transistors.

SUMMARY

This invention in part contemplates apparatus and associated methods for providing body contacts in SOI transistors. In one illustrative embodiment, an IC according to the invention includes an SOI transistor. The SOI transistor has at least two source regions and at least two respective isolation regions, a body contact region coupled electrically to a body region of the SOI transistor, a drain region, and a gate. The gate is configured to control the flow of current between the source regions and the drain region of the transistor. One of the isolation regions is disposed between one of the source regions and the body contact region. Similarly, the other isolation region is disposed between the second source region and the body contact region.

In another illustrative embodiment, an IC according to the invention includes at least two source regions, a body contact region, a drain region, and a gate with at least two extension gates. The body contact region couples electrically to a body region of the SOI transistor. The gate is configured to control the flow of current between the source regions and the drain region. The extension gates couple to the gate. One of the extension gates is disposed adjacent to the body contact region and the one of the source regions. Similarly, the second extension gate is disposed adjacent to the body contact region and the second source region.

Furthermore, the inventive concepts in part contemplate ESD protection circuitry or devices (or ESD circuitry or devices) for transistors in ICs. In one illustrative embodiment, an IC according to the invention includes a transistor that has an ESD protection device. The ESD protection device includes a contact and a metal element (e.g., at least a portion of a metal layer within the IC), and one or more via/metal element combinations or sets. The contact couples to a semiconductor region of the transistor, such as its source region or its drain region and also to the metal element. The metal element in turn couples to one or more alternating combinations of vias and metal elements. For example, the metal element coupled to the contact may couple to a via that in turn couples to another metal element, and so on, as desired.

DESCRIPTION OF THE DRAWINGS

The appended drawings illustrate only exemplary embodiments of the invention and therefore should not be considered as limiting its scope. The disclosed inventive concepts lend themselves to other equally effective embodiments. In the drawings, the same numeral designators used in more than one drawing denote the same, similar, or equivalent functionality, components, or blocks.

DETAILED DESCRIPTION

This invention in part contemplates apparatus and associated methods for providing body contacts in SOI transistors. Transistors with body contacts according to the invention provide several advantages over conventional body contacts. The advantages include relatively small areas and the availability of each of the transistor terminals (source, drain, gate, and body) separately from the other terminals, thus allowing the independent coupling of each terminal to a desired nose in a circuit.

Moreover, the inventive concepts contemplate ESD protection circuitry (or ESD circuitry) for transistors in ICs. The ESD circuits help to protect against damage from electrostatic discharge or, generally, over-voltage or transient-voltage conditions that may otherwise damage the transistor or degrade or impair its operation.

In a typical bulk device, such as a metal oxide semiconductor field-effect transistor (MOSFET) fabricated in a silicon wafer, the device has a source, a drain, a gate, and a body. The body of the MOSFET typically constitutes the wafer substrate. Thus, one may provide a contact to the body of the MOSFET relatively easily, for example, by providing a contact to the substrate, using techniques well known to persons of ordinary skill in the art. One may couple the body of the MOSFET to a desired node or point in the IC, such as ground (or $V_{SS}$), a supply voltage (or $V_{DD}$), and the like.

In contrast, providing a body contact in an SOI transistor presents more challenges than a bulk transistor. In an SOI transistor, the transistor's body, source, and drain reside over a layer of insulator. Put another way, the transistor's body, source, and drain reside in a layer of semiconductor deposited or fabricated over the layer of insulator (hence the nomenclature "silicon on insulator," or "SOI").

The layer of insulator itself resides over a substrate. Thus, the layer of insulator electrically insulates the body of the transistor from the substrate. Hence, one cannot simply use the substrate to provide a body contact for the transistor. One aspect of the invention relates to providing body contacts for SOI transistors without a substantial increase in the area of the transistor or limiting the topology of the circuit in which ones uses the transistor.

Figure 1:
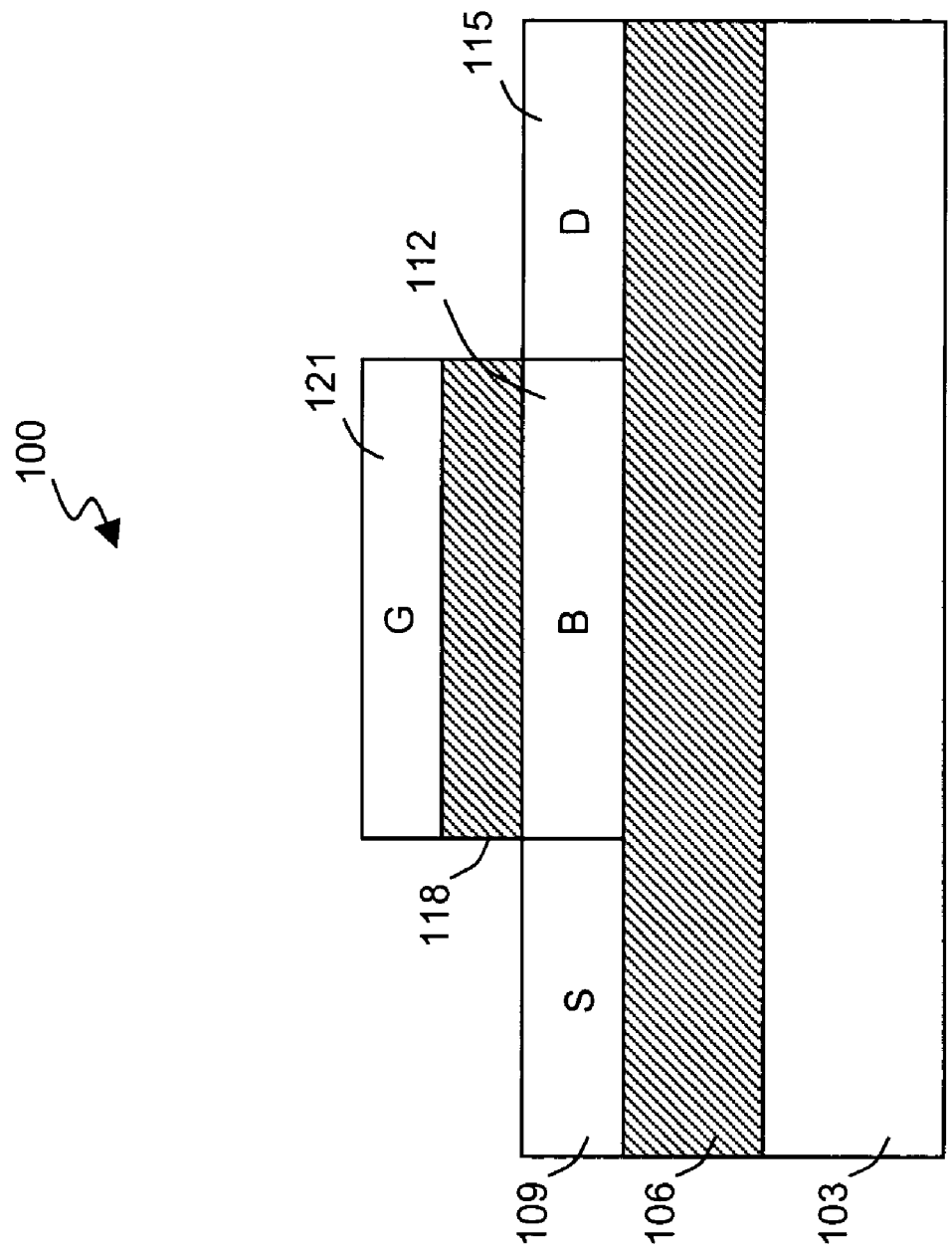
FIG. 1 shows a simplified cross-section of an SOI transistor according to an exemplary embodiment of the invention.

FIG. 1 illustrates a simplified cross-section of an SOI transistor 100 according to an exemplary embodiment of the invention. SOI transistor 100 includes substrate 103, dielectric layer 106, source region 109, body region 112, drain region 115, gate dielectric layer 118, and gate 121.

Substrate 103, together with dielectric layer 106, and source region 109, body region 112, and/or drain region 115 provide the SOI structure. Source region 109, body region 112, and drain region 115 each constitutes a region of semiconductor, such as a doped (e.g., diffused or implanted) silicon region. Dielectric layer 106 constitutes a layer of silicon dioxide ($SiO_2$). As persons of ordinary skill in the art who have the benefit of the description of the invention understand, however, one may use other types of dielectric or insulator, as desired.

Source region 109 and drain region 115 may couple to a suitable coupling mechanism, such as a contact, to provide electrical connections to transistor 100. Similarly, gate 121 may couple to a suitable coupling mechanism, such as a polysilicon trace, to supply a control signal to transistor 100.

Body region 112 couples to a body contact (not shown explicitly) according to the invention. Through the body contact, one may couple body region 112 to any desired node or point in a circuit or to a node within an IC (not shown) within which transistor 100 may reside, as desired.

More particularly, coupling body region 112 to a given voltage affects the electrical characteristics of transistor 100, as persons of ordinary skill in the art with the benefit of the description of the invention understand. By selecting an appropriate voltage, one may cause transistor 100 to meet desired electrical specifications, as desired. Thus, by using the body contact to bias transistor 100, one may affect the electrical characteristics of transistor 100, as desired.

Figure 2:
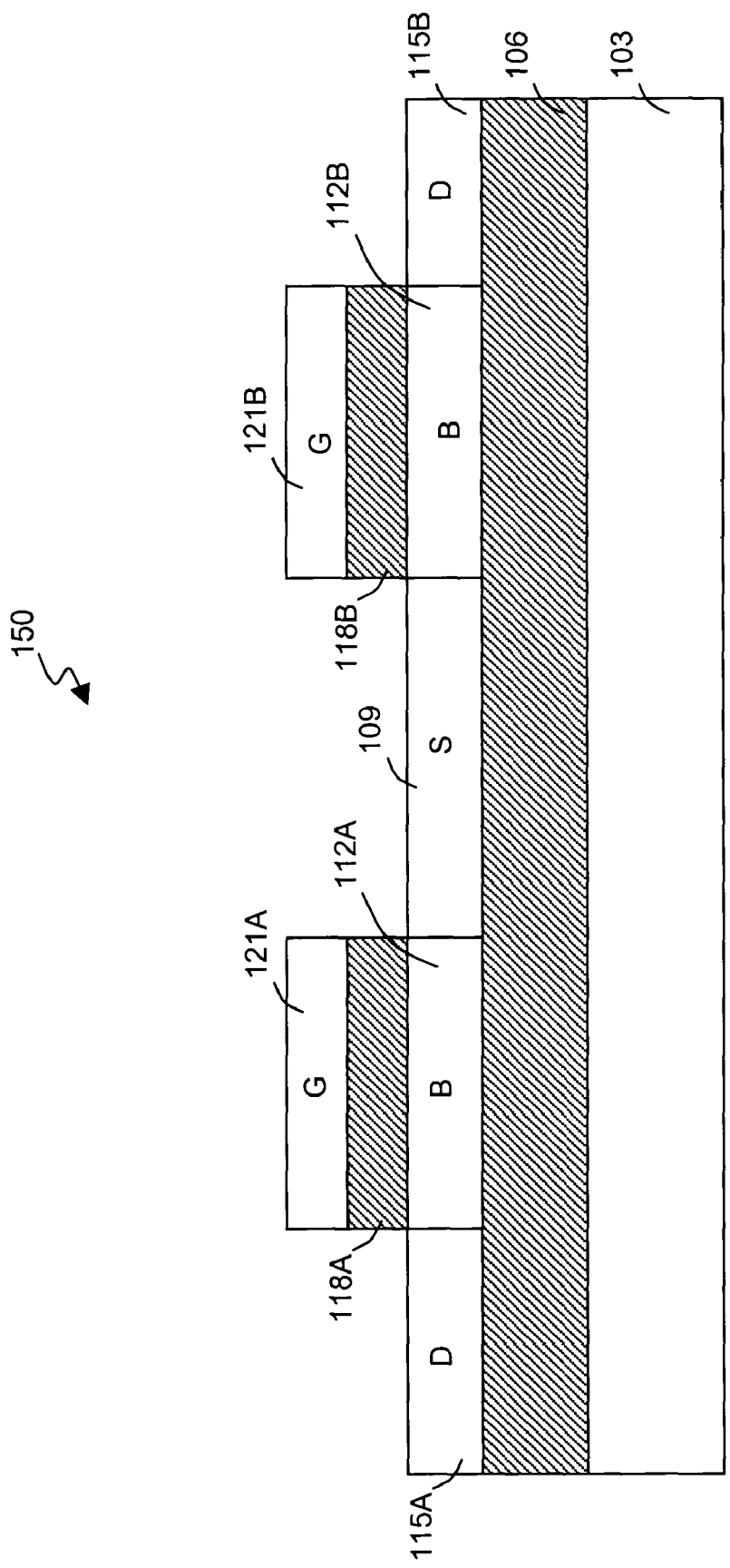
FIG. 2 illustrates a simplified cross-section of another SOI transistor according to an illustrative embodiment of the invention.

FIG. 2 shows a simplified cross-section of an SOI transistor 150 according to an illustrative embodiment of the invention. The cross-section of SOI transistor 150 includes substrate 103, dielectric layer 106, source region 109, body regions 112A and 112B, drain regions 115A and 115B, gate dielectric layers 118A and 118B, and gates 121A and 121B.

Note that the dual gates 121A, dual body regions, and dual drain regions of transistor 150 allow its use in more than mode of operation. In a first mode of operation, one may couple in parallel drain regions 115A–115B, and further couple together gates 121A–121B. That circuit arrangement results in two parallel transistors, with a corresponding current-handling capability.

One may use such a circuit arrangement in situations that call for a transistor with relatively high levels of current-handling capability, such as in input/output (I/O) circuits, as desired. Note further that one may provide body contacts (not shown explicitly) for body regions 112A–112B, and that one may provide a separate contact for each of body regions 112A–112B, as desired.

In another mode of operation, one may control gate 121A independently of gate 121B in order to control the flow of current through drain region 115A independently of the current flow through drain region 115B. Thus, in effect, such a circuit arrangement provides two transistors, each a control gate independent of the other transistor.

More specifically, the first transistor includes drain region 115A, gate 121A (and gate dielectric 118A), and source region 109. The second transistor includes drain region 115B, gate 121B (and gate dielectric 118B), and source region 109. Put another way, the two transistors have region 109 in common. One may use this circuit arrangement in order to reduce the effective area of the two transistors (by sharing source region 109). Note further that one may provide body contacts (not shown explicitly) for body regions 112A–112B, and that one may provide a separate contact for each of body regions 112A–112B, as desired.

Substrate 103, together with dielectric layer 106, and source region 109, body regions 112A–112B, and/or drain regions 115A–115B provide the SOI structure. Source region 109, body regions 112A–112B, and drain regions 115A–115B each constitutes a region of semiconductor, such as a doped (e.g., diffused or implanted) silicon region. Dielectric layer 106 constitutes a layer of silicon dioxide ($SiO_2$), or other type of dielectric or insulator, as desired, and as persons of ordinary skill in the art who have the benefit of the description of the invention appreciate.

Source region 109 and drain regions 115A–115B may couple to a suitable coupling mechanism, such as a contact, to provide electrical connections to transistor 150. Similarly, each or both of gates 121A–121B (depending on the particular circuit arrangement, as described above) may couple to one or more suitable coupling mechanism(s), such as a polysilicon trace, to supply one or more control signals to transistor 150.

As noted above, each of body regions 112A–112B couples to a body contact (not shown explicitly) according to the invention. Through the body contacts, one may couple each of body regions 112A–112B to any desired node or point in a circuit or to a node within an IC (not shown) within which transistor 150 may reside, as desired.

More particularly, coupling each of body regions 112A–112B to a given voltage affects the electrical characteristics of the corresponding transistor (or transistors, depending on the desired mode of operation, as described above), as persons of ordinary skill in the art with the benefit of the description of the invention understand. By selecting an appropriate voltage, one may cause the transistor or transistors to meet desired electrical specifications, as desired.

Thus, by using the body contacts to bias the transistor(s), one may affect the electrical characteristics of the transistor(s), as desired. Note that, depending on a particular circuit arrangement and desired resulting electrical characteristics, one may couple both body regions 112A–112B to the same node or voltage, as desired.

Figure 3:
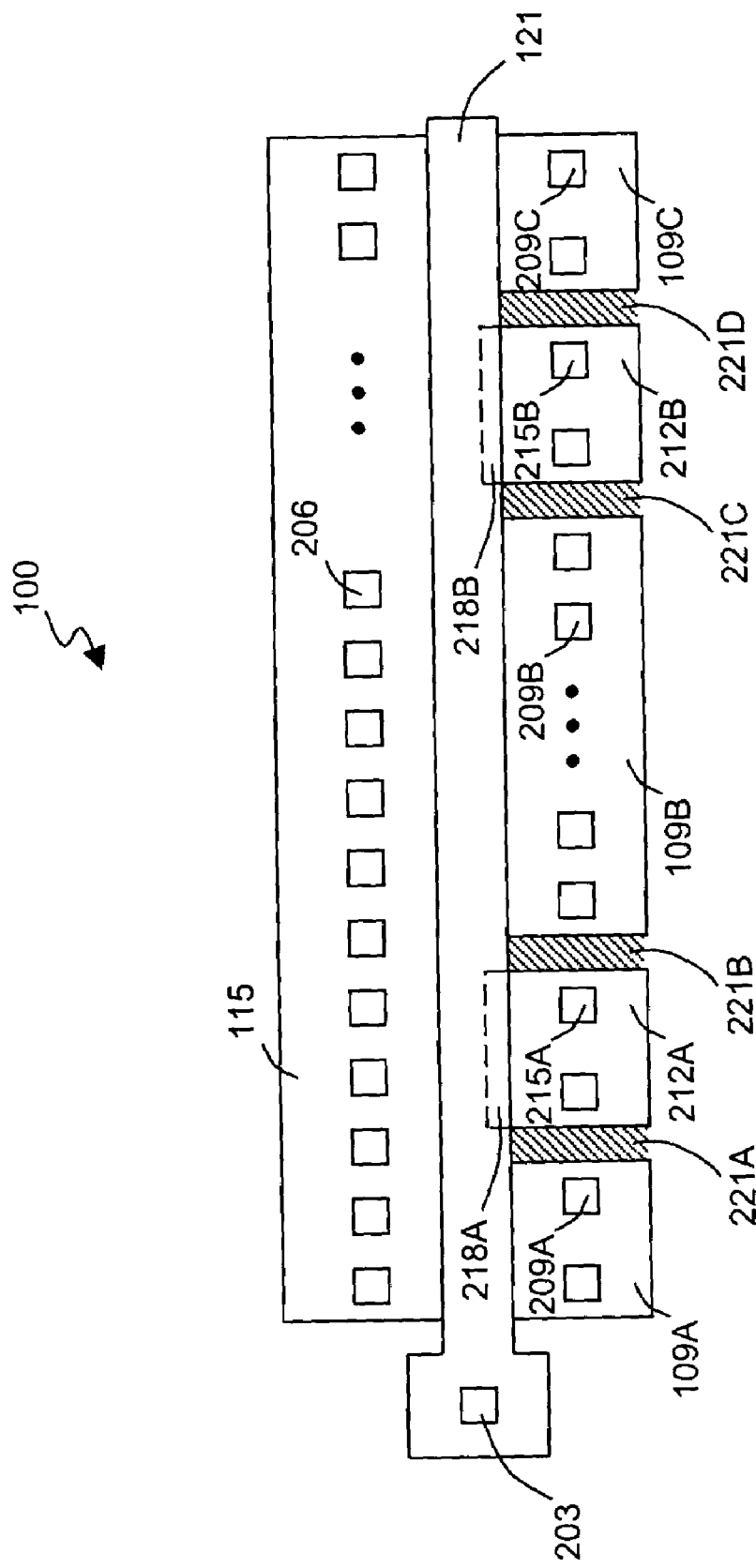
FIG. 3 depicts a top view of an SOI transistor with body contacts according to an exemplary embodiment of the invention.
Figure 4:
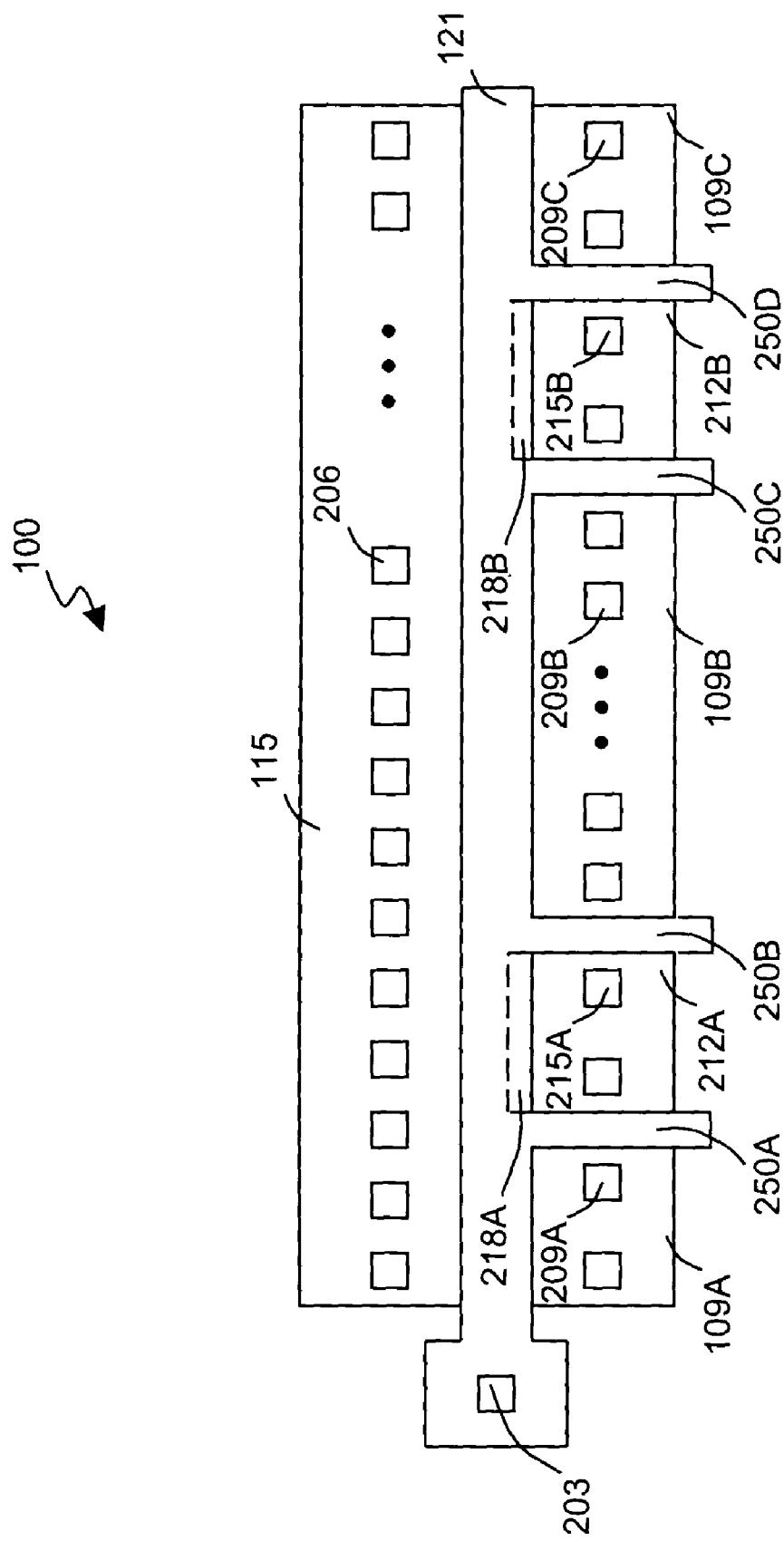
FIG. 4 shows a top view of an SOI transistor with body contacts according to an alternative embodiment of the invention.

FIGS. 1 and 2 illustrate general structures of SOI transistors according to the invention that have body contacts. FIGS. 3 and 4 show details of the body contacts. More specifically, FIGS. 3 and 4 depict alternative ways of implementing body contacts in SOI transistor 100 (see FIG. 1).

FIG. 3 shows a top view of an SOI transistor 100 with body contacts according to an exemplary embodiment of the invention. SOI transistor 100 includes drain region 115, gate 121, and source region 109, which consists of several portions. More specifically, source region 109 includes regions 109A, 109B, and 109C.

One or more contacts 206 provide a mechanism for coupling to drain region 115. In other words, through contact(s) 206, one may couple other parts of a circuit (e.g., parts of an IC that includes SOI transistor 100) to drain region 115. Similarly, one or more contacts 209A, 209B, and 209C provide a mechanism for coupling to each of source regions 109A, 109B, and 109C, respectively. Contact 203 provides a mechanism for coupling to gate 121 (although one may use more than one contact, as desired).

SOI transistor 100 includes body contact regions 212A and 212B. Each of body contact regions 212A and 212B includes an area of semiconductor (for example, a doped, implanted, or diffused semiconductor region). Body contact regions 212A and 212B have the same dopant type as the body regions of transistor 100 (for example, body regions 112A–112B in FIG. 2) and, thus, the opposite doping type of source regions 109A–109C. Body contact regions 212A–212B provide a mechanism for coupling to the body (not shown explicitly in FIG. 3) of SOI transistor 100.

As FIG. 3 illustrates, source regions 109A–109C and body contact regions 212A–212B form alternating semiconductor regions with respective alternating types of dopants, separated by isolation regions 221A–221D. Isolation regions 221A, 221B, 221C, and 221D isolate source regions 109A, 109B, and 109C from the corresponding body contact regions 212A and 212B.

More specifically, isolation region 221A and isolation region 221B isolate body contact region 212A from source region 109A and source region 109B, respectively. Similarly, isolation region 221C and isolation region 221D isolate body contact region 212B from source region 109B and source region 109C, respectively.

Isolation regions 221A–221D may include any suitable dielectric or insulator, as persons of ordinary skill in the art who have the benefit of the description of the invention understand. For example, in some embodiments according to the invention, the dielectric material may constitute silicon dioxide ($SiO_2$), as desired. As another example, in some embodiments according to the invention, the dielectric material may constitute silicon carbide (SiC), as desired. The choice of dielectric material depends on a number of factors apparent to persons of ordinary skill in the art who have the benefit of the description of the invention, such as available or desired process technologies, design and performance specifications, and the like.

In illustrative embodiments according to the invention, isolation regions 221A–221D constitute shallow trench isolation (STI) regions. One may use traditionally available techniques to fabricate the STI regions, as desired. The STI regions provide the function described above, i.e., electrical isolation between the source and body contact regions of transistor 100.

One or more contacts 215A provide a mechanism for coupling to body contact region 212A. In other words, through contact(s) 215A, one may couple other parts of a circuit (e.g., parts of an IC that includes SOI transistor 100) to body contact region 212A. Similarly, one or more contacts 215B provide a mechanism for coupling to body contact region 212B.

Note that, in the embodiment shown, the areas defining body contact regions 212A–212B overlap with gate 121. More specifically, body contact region 212A overlaps with gate 121, with the area of overlap shown as overlap area 218A. Similarly, body contact region 212B overlaps with gate 121, with the area of overlap depicted as overlap area 218B.

Overlap area 218A and overlap area 218B help to provide a path for the conduction of majority carriers (e.g., holes in an N-channel transistor) to body contact region 212A and body contact region 212B, respectively. As persons skilled in the art understand, the majority carriers exist within the body of transistor 100 (because of the doping of the body) and/or because of impact ionization caused by high-energy minority carriers colliding with the semiconductor lattice of the transistor's body.

In the absence of overlap area 218A–218B, dopants (e.g., dopants from ion implantation of the source and drain of the transistor) may penetrate or become lodged at or near the intersection of gate 121 and body contact regions 211A–212B because of process imperfections (e.g., misalignment). The dopants may impede or reduce the flow of majority carriers to body contacts 215A–215B. The overlap areas help to avoid such a situation.

As persons of ordinary skill in the art with the benefit of the description of the invention understand, however, one may omit overlap areas 218A–218B under some circumstances, as desired. For example, one may exclude overlap areas 218A–218B if the semiconductor fabrication process used results in transistor 100 having satisfactory performance characteristics in the absence of overlap areas 218A–218B.

FIG. 4 shows a top view of an SOI transistor 100 with body contacts according to an alternative embodiment of the invention. Transistor 100 in FIG. 4 includes elements that are the same or similar to, and function in the same or like manner, as the corresponding elements of transistor 100 in FIG. 3. Note, for example, that transistor 100 in FIG. 4 includes overlap areas 218A 218B (described above). Rather than using isolation regions 221A–221D, however, transistor 100 uses extension gates or fingers, as described below in detail.

Referring to FIG. 4, transistor 100 includes extension gates 250A–250D. Extension gates 250A–250D serves to provide electrical isolation between source regions 109A–109C and corresponding body contact regions 212A–212B. More specifically, extension gates 250A–250D and the semiconductor regions beneath them provide the isolation. Extension gates 250A–250C provide the isolation by blocking the source/drain implants into the semiconductor (silicon) under extension gates 250A–250D, and thus forming a PN-junction between source regions 109A–109C and body contact regions 212A–212B.

As FIG. 4 shows, source regions 109A–109C and body contact regions 212A–212B form alternating semiconductor regions with respective alternating types of dopants, separated by extension gates 250A–250D. Extension gate 250A and extension gate 250B isolate body contact region 212A from source region 109A and source region 109B, respectively. Similarly, extension gate 250C and extension gate 250D isolate body contact region 212B from source region 109B and source region 109C, respectively.

Note that one may implement the body contacts shows in FIGS. 3 and 4 in SOI transistors other than SOI transistor 100 shown in FIG. 1. For example, one may implement the body contacts in SOI transistor 150 (see FIG. 2) by making modifications that fall within the knowledge and skill of persons skilled in the art with the benefit of the description of the invention.

FIGS. 3 and 4 show illustrative numbers and configurations of contacts, body contact regions, source regions, drain regions, and gate configurations. As persons of ordinary skill in the art who have the benefit of the description of the invention appreciate, depending on the design and performance considerations for a given implementation, one may use other numbers, arrangement, and configuration of those elements. For example, one may use a single body contact region, or more than two body contact regions, as desired. Similarly, one may include a corresponding number of body contact(s), source region(s), isolation region(s), and/or extension gate(s), as desired.

Another aspect of the invention relates to ESD protection circuitry in ICs. More specifically, by including ballast resistor(s) (resistors for ESD protection) in transistors, one may protect them against ESD, over-voltage conditions, transients, and the like. One may integrate the ballast resistors vertically (e.g., above a drain region of a transistor).

Because of their vertical or three-dimensional structure, ESD protection circuits according to the invention provide a more area-efficient solution than conventional two-dimensional ballast resistors. Furthermore, because of their vertical structures, ESD protection circuitry according to the invention make electro-migration less of a concern than conventional solutions.

Figure 5:
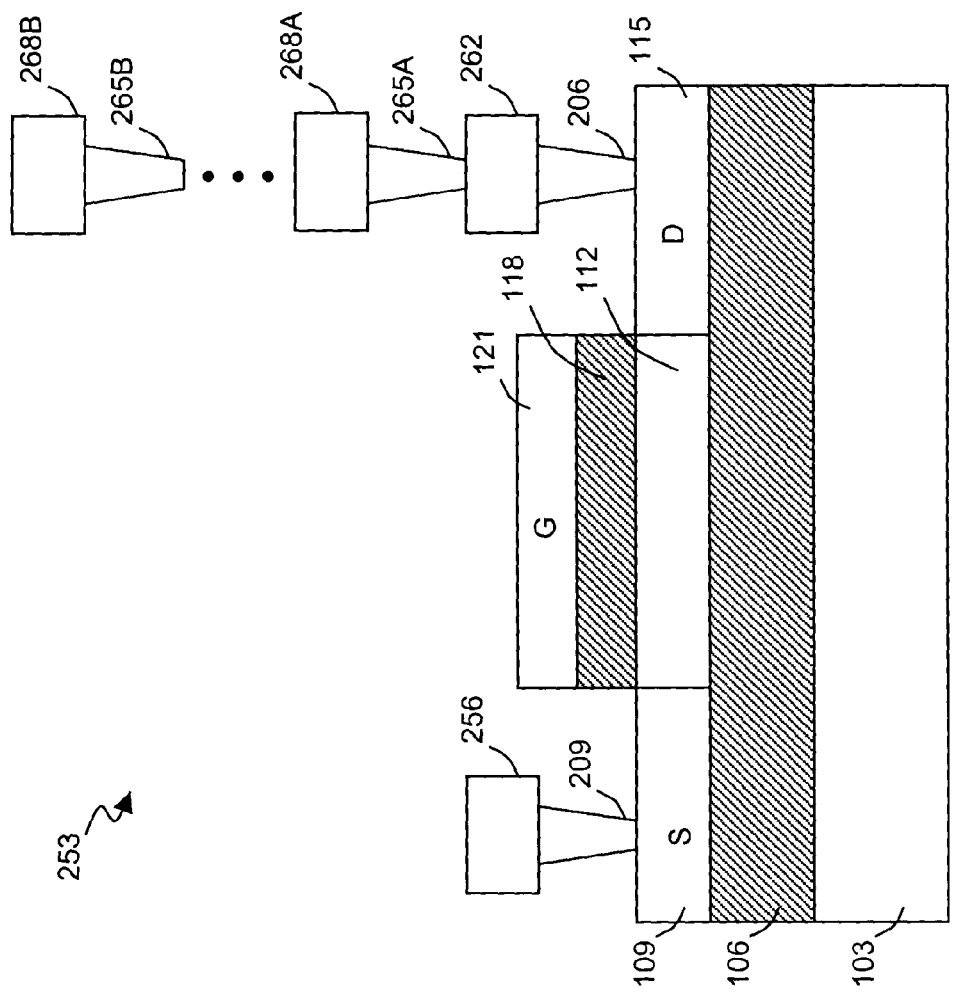
FIG. 5 illustrates a transistor according to an illustrative embodiment of the invention that includes ESD protection circuitry.

FIG. 5 shows a transistor 253 according to an illustrative embodiment of the invention that includes ESD protection circuitry. Transistor 253 has a structure and elements similar to transistor 100 (see FIG. 1). Note that contact 209 provides a mechanism for coupling source region 109 to metal layer 256 (or to any desired node or point in a circuit that uses transistor 253. Metal layer 256 may constitute a layer of metal (for example, a first metal layer) within the IC that includes transistor 253.

Transistor 253 includes a ballast resistor for ESD protection. The ballast resistor includes a contact coupled to a metal layer, which in turn couples to at least one pair of a via coupled to a metal layer.

FIG. 5 shows a ballast resistor coupled to drain region 115 of transistor 253. Contact 206 provides a mechanism for coupling to drain region 115. Contact 206 couples to metal layer 262, which may constitute a metal layer (for example, a first metal layer) within the IC that includes transistor 253.

Contact 206 (through metal layer 262) couples to via 265A, which in turn couples to metal layer 268A. Metal layer 268A may constitute a layer of metal within the IC that includes transistor 253. Metal layer 268A may couple to one or more combinations of vias and metal layers coupled together, up to via 265B and metal layer 268B. Metal layer 268B may constitute the top layer of the IC that includes transistor 253. In other words, one may use one contact and one metal layer, or one contact, followed by a metal layer, followed by a desired number of alternating vias and metal layers.

The cascade-coupled contact-metal layer and metal layer-via arrangements present an electrical resistance (a ballast resistor or resistance) to the circuit that includes transistor 253. The electrical resistance protects transistor 253 against ESD, over-voltage conditions, and transients, as described below in detail. More specifically, each of contact 206, metal layer 262, via(s) (265A–265B), and metal layer(s) coupled to the via(s) (268A–268B) has an electrical resistance. Together, their resistance forms the ballast resistor.

Note that one may apply to, or incorporate with, the ESD protection mechanism according to the invention to a variety of transistors, as desired. For example, FIG. 6 illustrates an exemplary ESD protection circuit according to the invention applied to transistor 150 (see FIG. 2).

Figure 6:
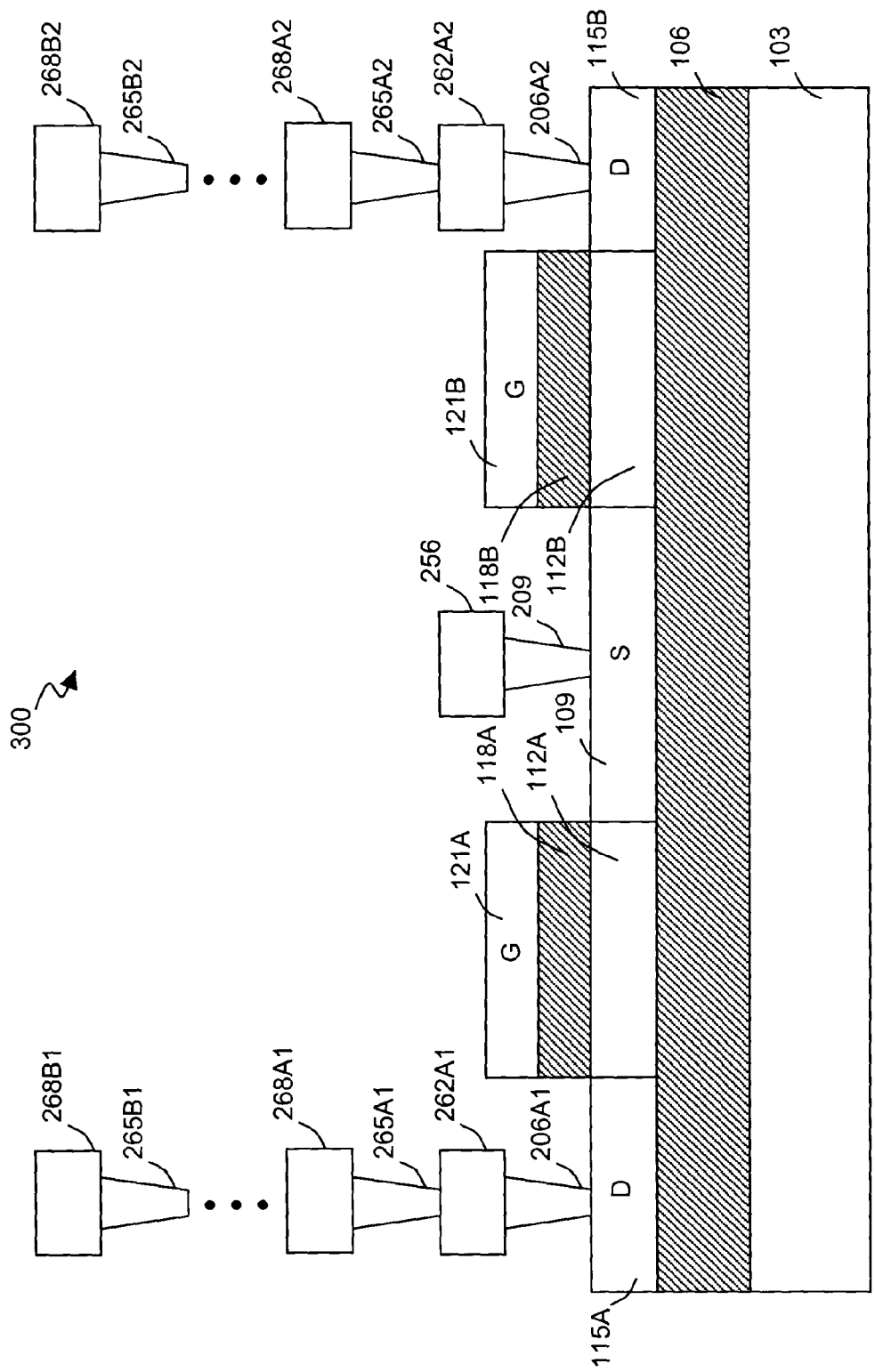
FIG. 6 depicts an exemplary ESD protection circuit according to the invention applied to a transistor.

More specifically, FIG. 6 illustrates transistor 300, which includes the structure of transistor 150, together with two ballast resistors. As described above, transistor 150 (and, hence, transistor 300) has two drain regions (115A and 115B). A ballast resistor couples to each of drain regions 115A–115B.

Contact 206A1 and contact 206A2 couple to drain region 115A and drain region 115B, respectively. Metal layer 262A1 and metal layer 262A2 couple to contact 206A1 and contact 206A2, respectively. Similar to the ballast resistor described above with respect to transistor 253, each ballast resistor for transistor 300 also includes at least one combination of a via and a metal layer.

Put another way, the ballast resistor for drain region 115A may include via(s) 265A1–265B1 and metal layers 268A1–268B1. Similarly, the ballast resistor for drain region 115B may include via(s) 265A2–265B2 and metal layers 268A2–268B2.

Figure 7:
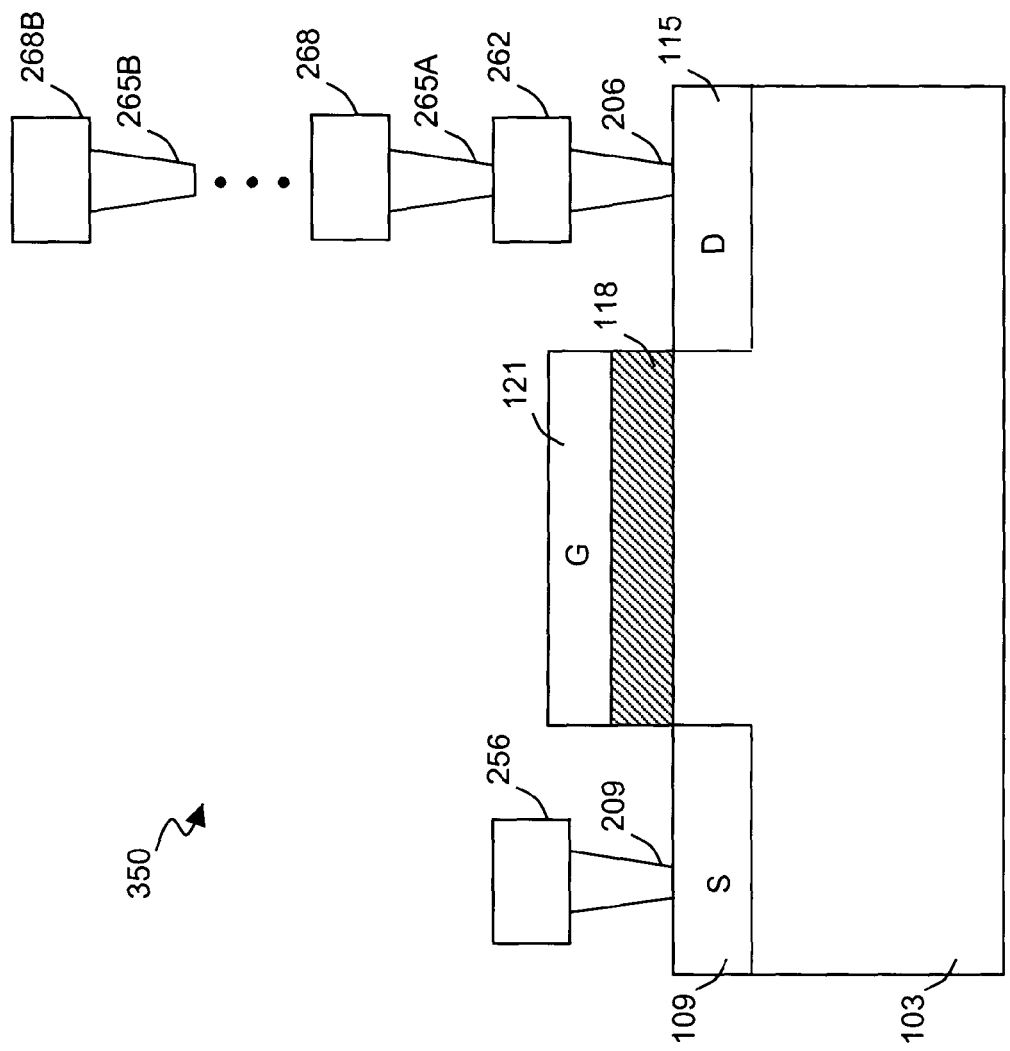
FIG. 7 shows a transistor according to another illustrative embodiment of the invention that includes ESD protection circuitry.

FIG. 7 shows a transistor 350 according to another illustrative embodiment of the invention that includes ESD protection circuitry. Transistor 350 has the structure of a conventional bulk device, such as a MOSFET fabricated in a semiconductor wafer.

Transistor 350 includes substrate 103, source region 109, body region 112, drain region 115, gate dielectric layer 118 (e.g., silicon dioxide, $SiO_2$), and gate 121, as known to persons skilled in the art. Contact 209 and metal layer 256 allow one to couple to source region 109 of transistor 350, as described above. Transistor 350 also includes a ballast resistor to provide ESD protection, similar to the ballast resistors described above.

The ballast resistor includes a contact coupled to a metal layer, which in turn couples to at least one pair of a via coupled to a metal layer. FIG. 7 shows a ballast resistor coupled to drain region 115 of transistor 350. Contact 206 provides a mechanism for coupling to drain region 115. Contact 206 couples to metal layer 262, which may constitute a metal layer (for example, a first metal layer) within the IC that includes transistor 350.

Furthermore, contact 206 couples to via 265A (through metal layer 262). Via 256A in turn couples to metal layer 268A. Metal layer 268A may constitute a layer of metal within the IC that includes transistor 253. Metal layer 268A may couple to one or more combinations of vias and metal layers coupled together (up to via 265B and metal layer 268B). Metal layer 268B may constitute the top layer of the IC that includes transistor 253. In other words, to fabricate the ballast resistor, one may use one contact and one metal layer, or one contact, followed by a metal layer, followed by a desired number of alternating vias and metal layers.

As described above, transistors according to illustrative embodiments of the invention may include more than one contact for the source region or the drain region. One may provide a ballast resistor for each contact or for some of the contacts, as desired.

Figure 8:
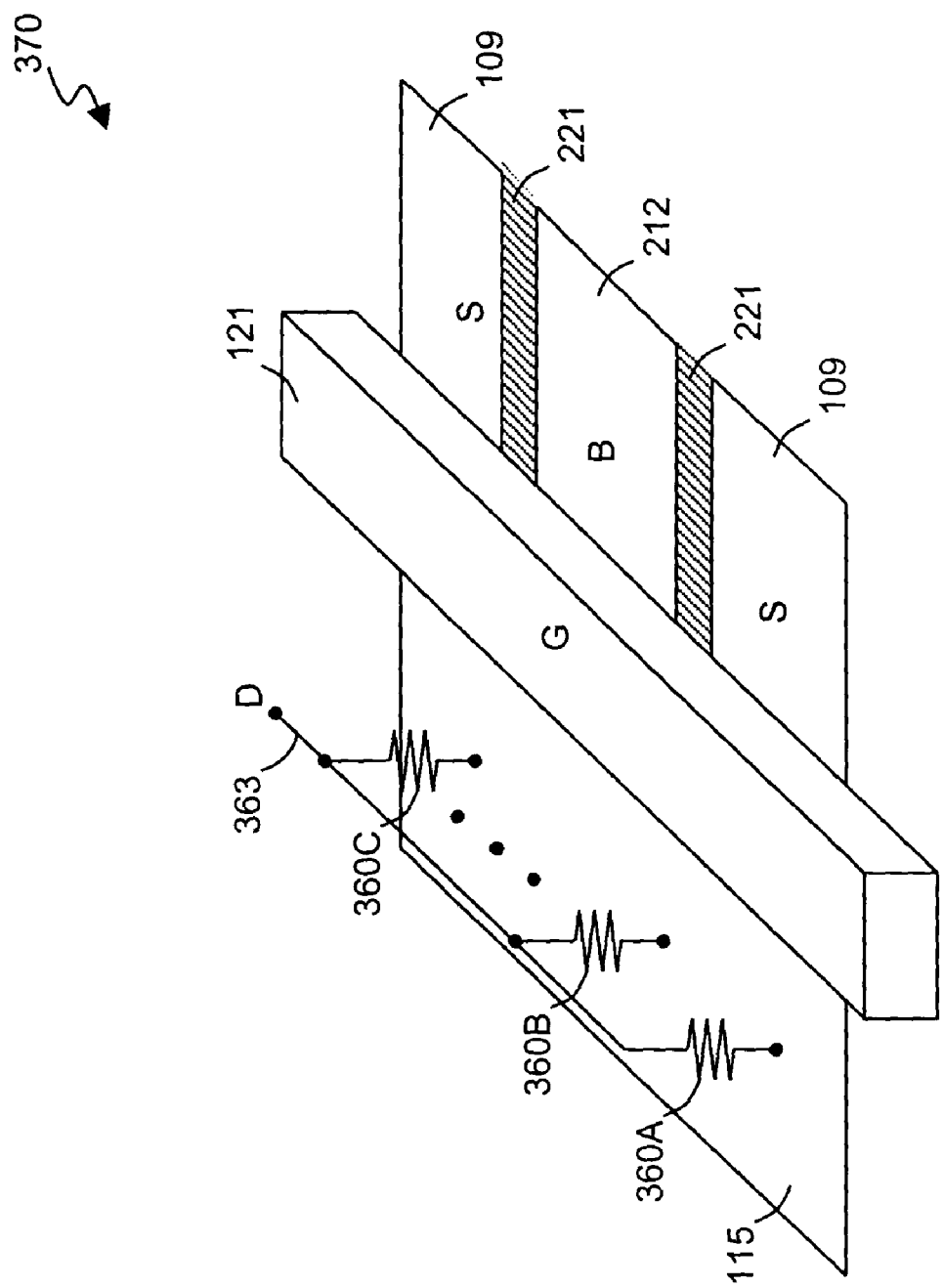
FIG. 8 illustrates a transistor according to another illustrative embodiment of the invention that includes ESD protection circuitry.

FIG. 8 depicts a transistor 370 according to an exemplary embodiment of the invention that includes ESD protection circuitry. The structure of transistor 370 corresponds to the structure of transistor 100 in FIG. 3, but only with one body region contact 212. Furthermore, transistor 370 includes ESD protection circuitry.

Transistor 370 includes a ballast resistor for each contact coupled to drain region 115 of the transistor. More specifically, each of a plurality of drain contacts (not shown explicitly) in a corresponding one of ballast resistors 360A–360C couples to drain region 115. The other terminals of the ballast resistors (last metal layer in the ballast resistor) couple together to form drain terminal 363 of transistor 370. Each ballast resistor 360A–360C may have the structure described above.

Figure 9:
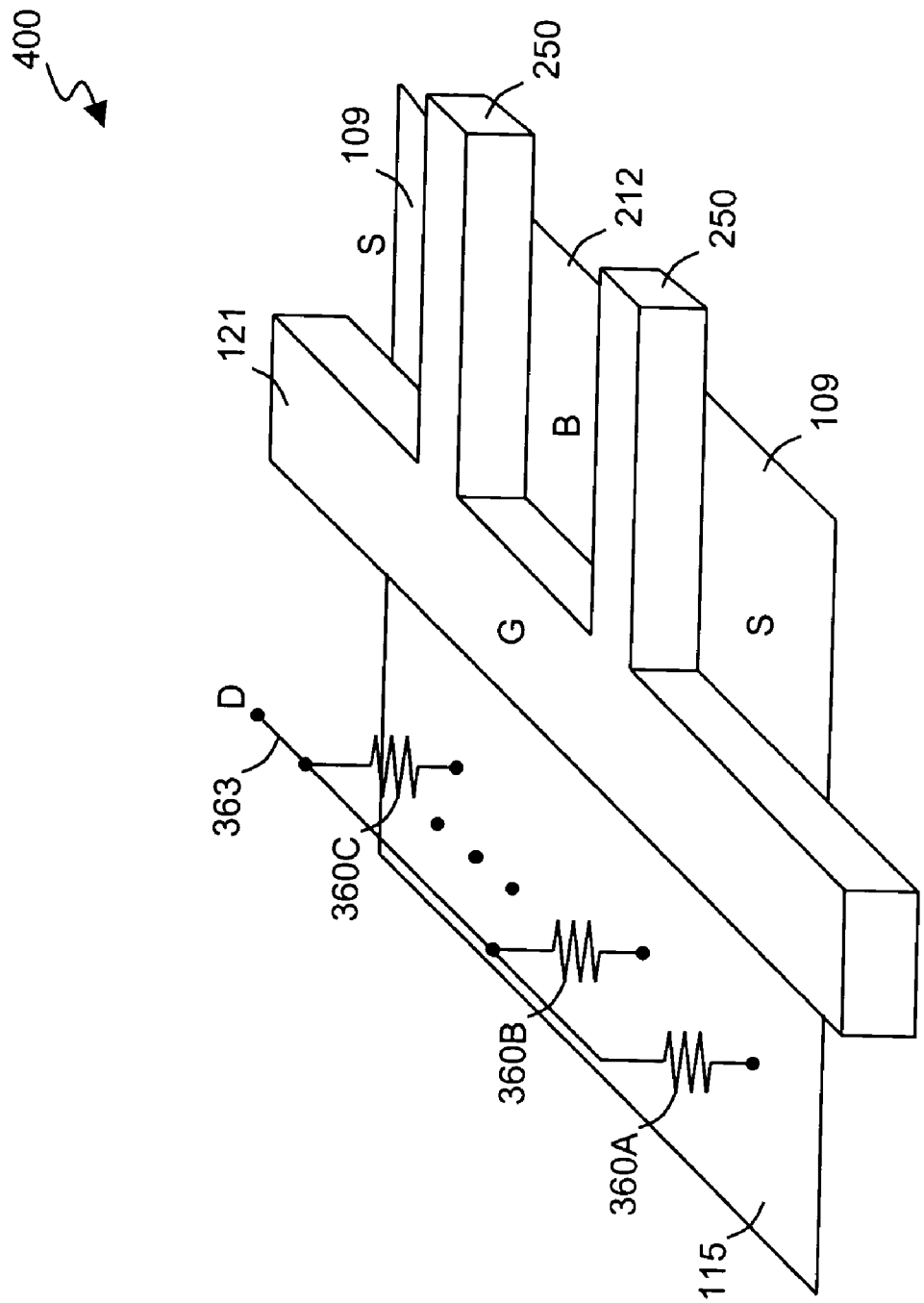
FIG. 9 depicts a transistor according to another illustrative embodiment of the invention that includes ESD protection circuitry.

FIG. 9 depicts a transistor 400 according to an exemplary embodiment of the invention that includes ESD protection circuitry. The structure of transistor 400 corresponds to the structure of transistor 100 in FIG. 4, but only with one body region contact 212. In addition, transistor 400 includes ESD protection circuitry.

Similar to transistor 370 described above, transistor 400 includes a ballast resistor for each contact coupled to drain region 115 of the transistor. More specifically, each of a plurality of drain contacts (not shown explicitly) in a corresponding one of ballast resistors 360A–360C couples to drain region 115. The other terminals of the ballast resistors (last metal layer in the ballast resistor) couple together to form drain terminal 363 of transistor 400. Each ballast resistor 360A–360C may have the structure described above.

Figure 10:
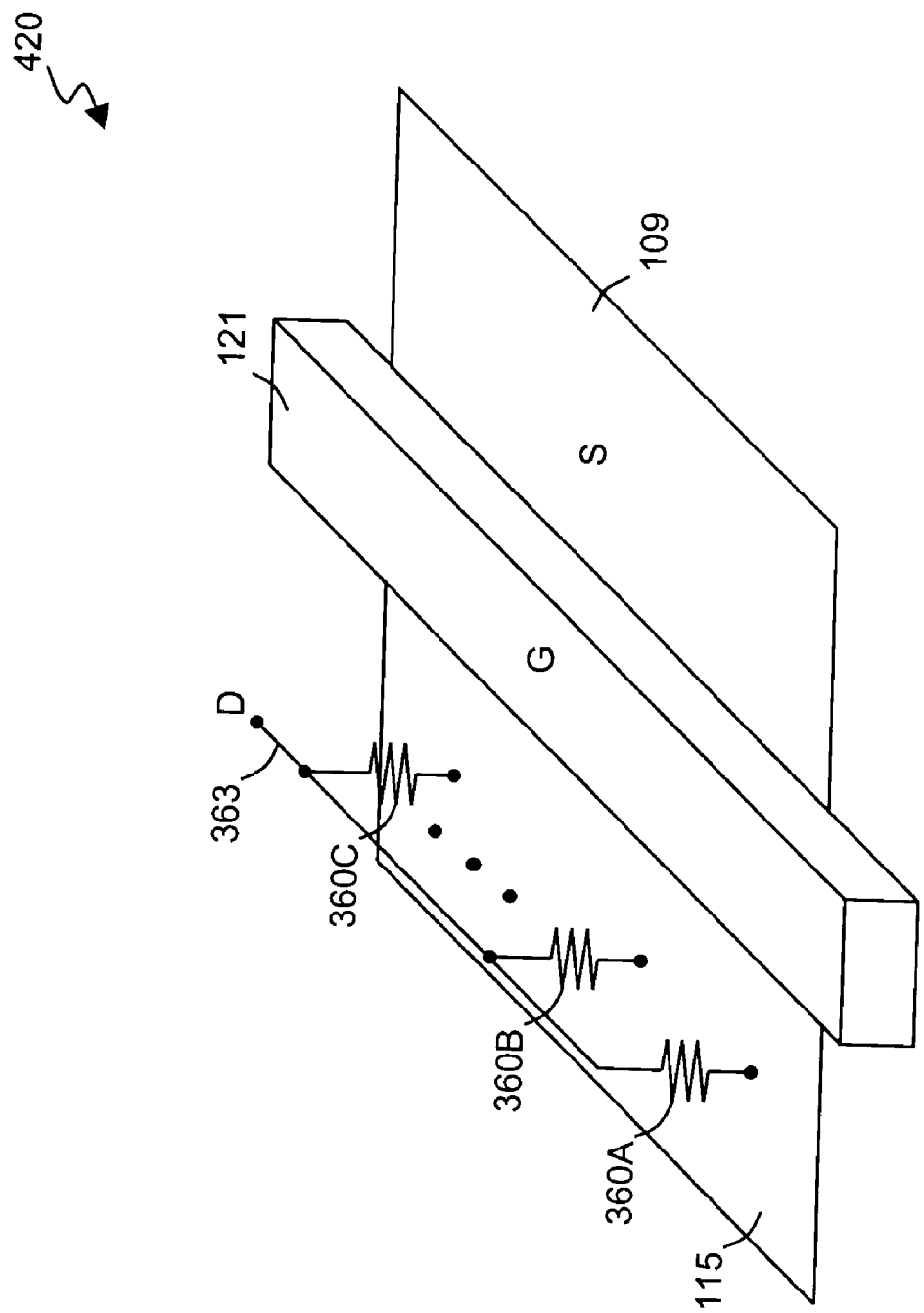
FIG. 10 shows depicts a transistor according to another illustrative embodiment of the invention that includes ESD protection circuitry.

FIG. 10 depicts a transistor 420 according to an exemplary embodiment of the invention that includes ESD protection circuitry. Transistor 400 may constitute an SOI transistor generally (with an optional body contact of a desired type and structure) or a bulk device, such as a conventional MOSFET, except that transistor 420 includes ESD protection circuitry according to the invention.

Similar to transistor 400 described above, transistor 420 includes a ballast resistor for each contact coupled to drain region 115 of the transistor. More specifically, each of a plurality of drain contacts (not shown explicitly) in a corresponding one of ballast resistors 360A–360C couples to drain region 115. The other terminals of the ballast resistors (last metal layer in the ballast resistor) couple together to form drain terminal 363 of transistor 420. Each ballast resistor 360A–360C may have the structure described above.

Note that the embodiments described above merely constitute illustrative embodiments. As persons of ordinary skill in the art who have the benefit of the description of the invention understand, one may design and implement ESD protection according to the invention in a variety of ways.

For example, rather than providing a ballast resistor for a drain region of a transistor, one may provide the ballast resistor for the source region of the transistor, as desired. As another alternative, one may provide a ballast resistor for both the source region and for drain region(s) of the transistor, as desired. Furthermore, metal layers described above (e.g., metal layer 262 in FIG. 5) may constitute segments or portions of a metal layer in IC, or a trace within an IC, and the like, as desired.

ESD protection according to the invention may use contacts and vias made of a variety of materials, as desired, and as persons skilled in the art with the benefit of the description of the invention understand. For example, depending on the fabrication process employed, one may use tungsten or copper to fabricate the contacts (e.g., contact 206 in FIG. 7).

Figure 11:
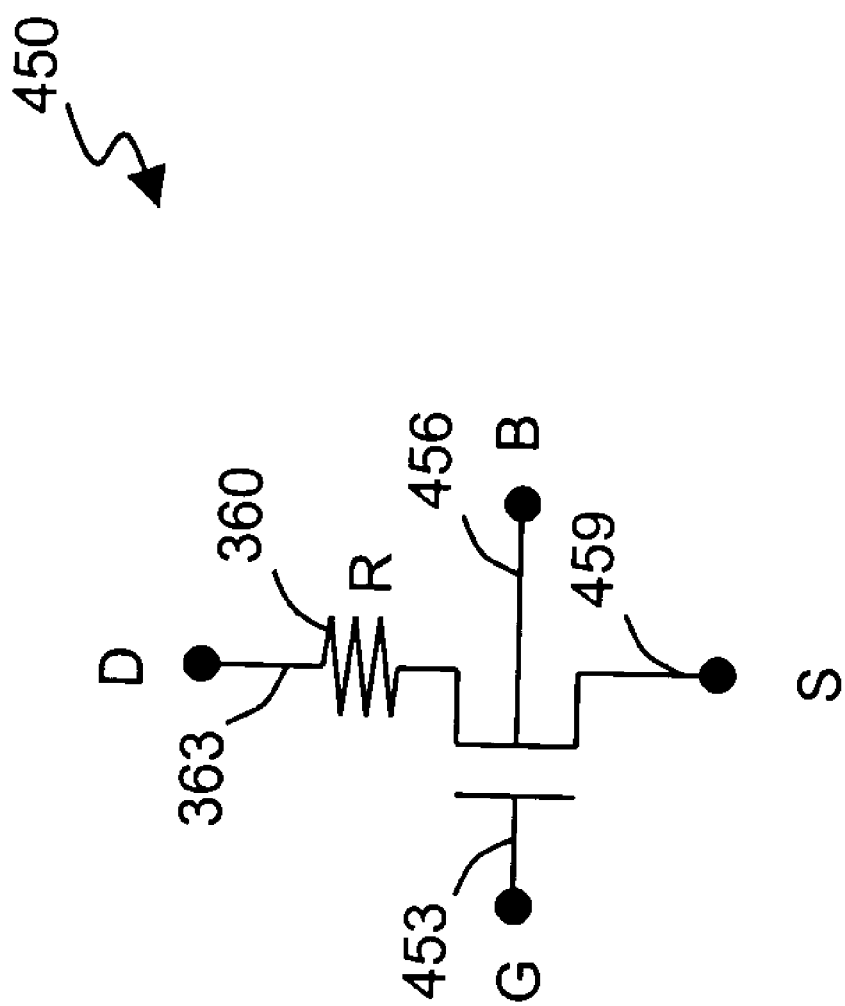
FIG. 11 illustrates a schematic for a transistor according to an exemplary embodiment of the invention that includes ESD protection.

FIG. 11 shows a schematic for a transistor 470 according to an exemplary embodiment of the invention that includes ESD protection. The schematic shows gate terminal 453, drain terminal 363, body terminal 456, and source terminal 459. One may couple each terminal to a desired node or circuit.

Note that resistor 360 represents the ballast resistor (internal to the transistor) used for ESD protection, as described above. Resistor 360 may represent the equivalent of all ballast resistors, if transistor 470 includes more than a single ballast resistor. For example, ballast resistor 360 may denote the parallel combination of ballast resistors 360A–360C (see FIGS. 8–10).

Figure 12:
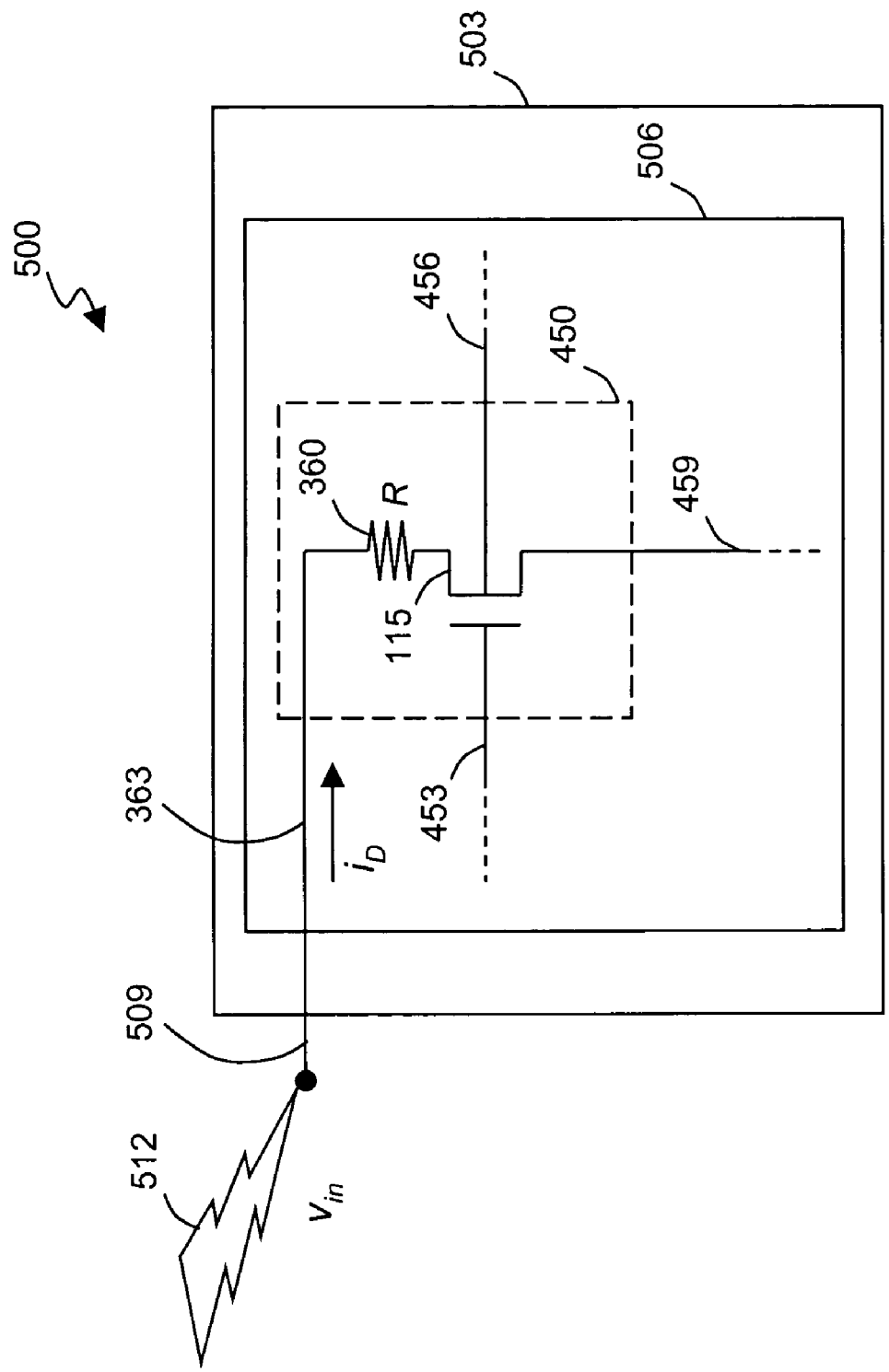
FIG. 12 depicts a circuit arrangement according to an exemplary embodiment of the invention.

FIG. 12 shows a circuit arrangement 500 according to an exemplary embodiment of the invention. Circuit arrangement 500 includes IC 503. IC 503 includes a circuit, represented by circuit block 506, which includes transistor 450. Circuit block 506 may constitute any desired circuit, as persons of ordinary skill in the art who have the benefit of the description of the invention understand. For example, a general analog circuit, a general digital circuit, a mixed-mode circuit, an input/out (I/O) circuit, and the like.

Drain terminal 363 of transistor 450 couples to an input (or I/O) terminal or pin 509 of IC 503. If an ESD voltage, over-voltage, or transient voltage 512 (denoted as $v_{in}$) occurs, ballast resistor 360 provides ESD protection by reducing the voltage experienced by drain region 115 of transistor 450. More specifically, the application of voltage 512 causes a drain current $i_D$ to flow in the drain terminal 363 of transistor 470. Ballast resistor 360 reduced the voltage at drain region 115 of transistor 470 to a value $v_{in} - R \times i_D$, where R denotes the resistance of ballast resistor 360. Thus, by selecting various values of R (and using design values for $v_{in}$ and $i_D$), one may provide desired levels of ESD protection to transistor 470.

Note that one may produce a variety of SOI transistors, depending on various factors, such as design and performance criteria, available process technology, and the like. The choice of transistor and device types falls within the knowledge of persons of ordinary skill in the art with the benefit of the description of the invention. Examples of transistor types include FD SOI transistors and partially depleted SOI (PD SOI) transistors. For more details of those and other types of transistors, see commonly owned U.S. patent application Ser. No. 10/154,394, titled "Apparatus and Methods For Silicon-On-Insulator Transistors in Programmable Logic Devices."

Figure 13:
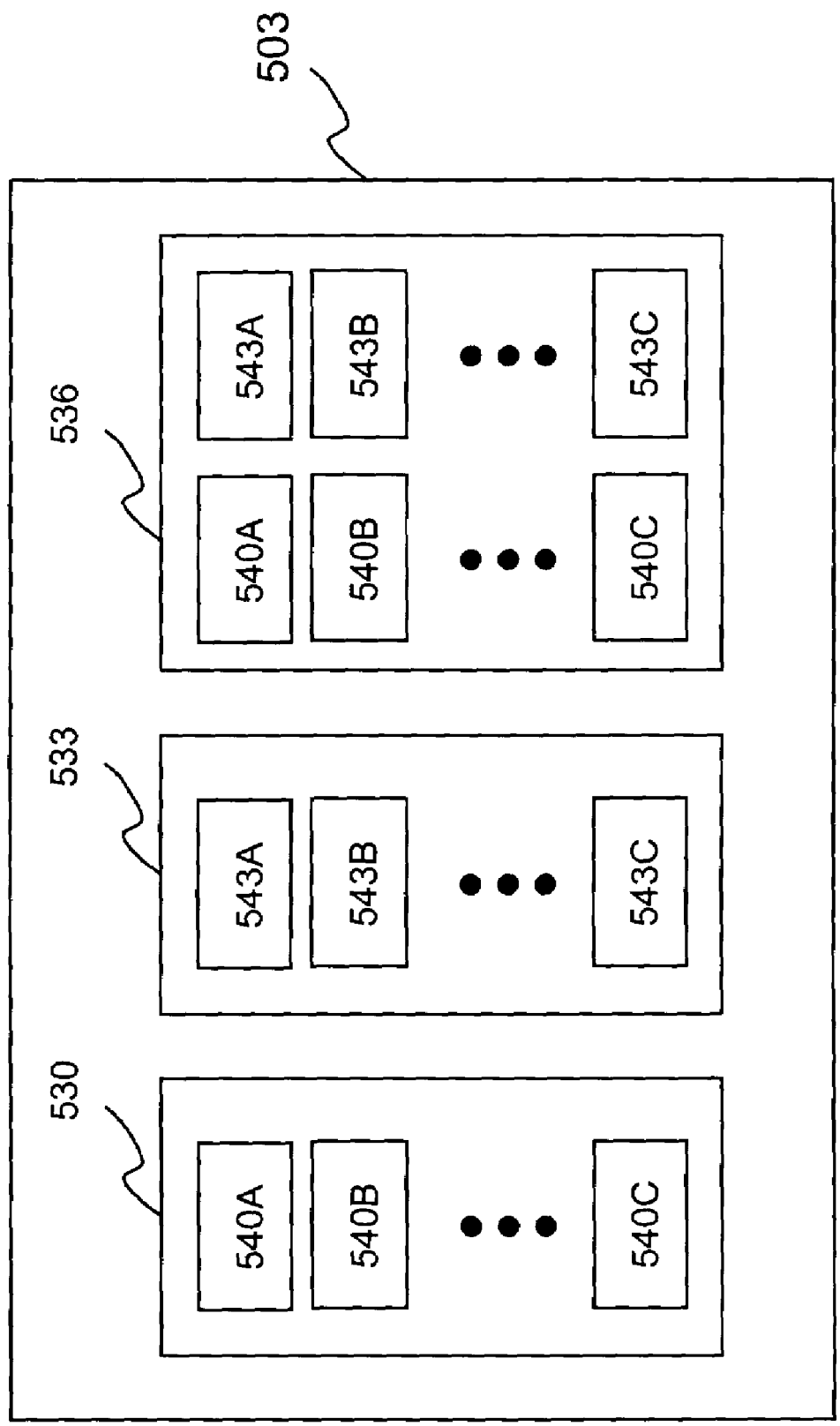
FIG. 13 shows a general block diagram of an IC according to an exemplary embodiment of the invention.

FIG. 13 shows a general block diagram of an IC 503 according to an exemplary embodiment of the invention. IC 503 may include at least one circuit or block 530, at least one circuit or block 533, and/or at least one circuit or block 536. In other words, IC 503 may include any desired combination of one or more of circuits 530, 533, and 536.

Circuit 530 includes one or more transistors according to the invention, denoted as transistors 540A–540C. Each transistor 540A–540C may include body contact(s) according to the invention, as described. For example, each transistor 540A–540C may constitute the transistors shown in FIGS. 1–4, as desired. One may implement any desired circuitry within circuit or block 530, for example, analog circuitry, digital circuitry, or mixed-mode circuitry, by coupling together transistors 540A–540C (together with other transistors, as desired).

Circuit 533 includes one or more transistors according to the invention, denoted as transistors 543A–543C. Each transistor 543A–543C may include ballast resistor(s) according to the invention, as described above. For example, each transistor 543A–543C may constitute the transistors shown in FIGS. 5–10, as desired. Similar to circuit 530 described above, one may implement any desired circuitry within circuit or block 533, for example, analog circuitry, digital circuitry, or mixed-mode circuitry, by coupling together transistors 543A–543C (together with other transistors, as desired).

Circuit 536 includes at least two sets of one or more transistors according to the invention. FIG. 13 denotes the transistors in the two sets in circuit 536 as transistors 540A–540C and transistors 543A–543C, respectively. Each transistor 540A–540C may include body contact(s) according to the invention, as described. Each transistor 543A–543C may include ballast resistor(s) according to the invention, as described above.

One may implement any desired circuitry within circuit or block 536, for example, analog circuitry, digital circuitry, or mixed-mode circuitry, by coupling together transistors 540A–540C (together with other transistors, as desired). Similarly, one may implement any desired circuitry within circuit or block 536, for example, analog circuitry, digital circuitry, or mixed-mode circuitry, by coupling together transistors 543A–543C (together with other transistors, as desired). Furthermore, note that one may couple together one or more of transistors 540A–540C with one or more of transistors 543A–543C to implement any desired circuitry within circuit or block 536, for example, analog circuitry, digital circuitry, or mixed-mode circuitry. In addition to transistor(s) 540A–540C and transistor 543A–543C, one may use other transistors (e.g., conventional SOI transistors or transistors without a ballast resistor) to implement the desired circuitry.

Moreover, one may couple together one or more of circuit 530, circuit 533, and circuit 536 to implement a given circuit, as desired. In other words, one may couple together one or more of circuits 530, 533, and 536 to implement other desired circuit blocks.

As merely one example of a specific type of IC 503, one may use the inventive concepts to produce programmable logic devices (PLDs) that include SOI devices with body contact(s), transistors with ESD protection, or both. Note that one may apply the inventive concepts effectively to programmable circuitry or ICs known by other names in the art, as desired, and as persons skilled in the art with the benefit of the description of the invention understand. Such circuitry include devices known as complex programmable logic device (CPLD), programmable gate array (PGA), and field programmable gate array (FPGA).

Figure 14:
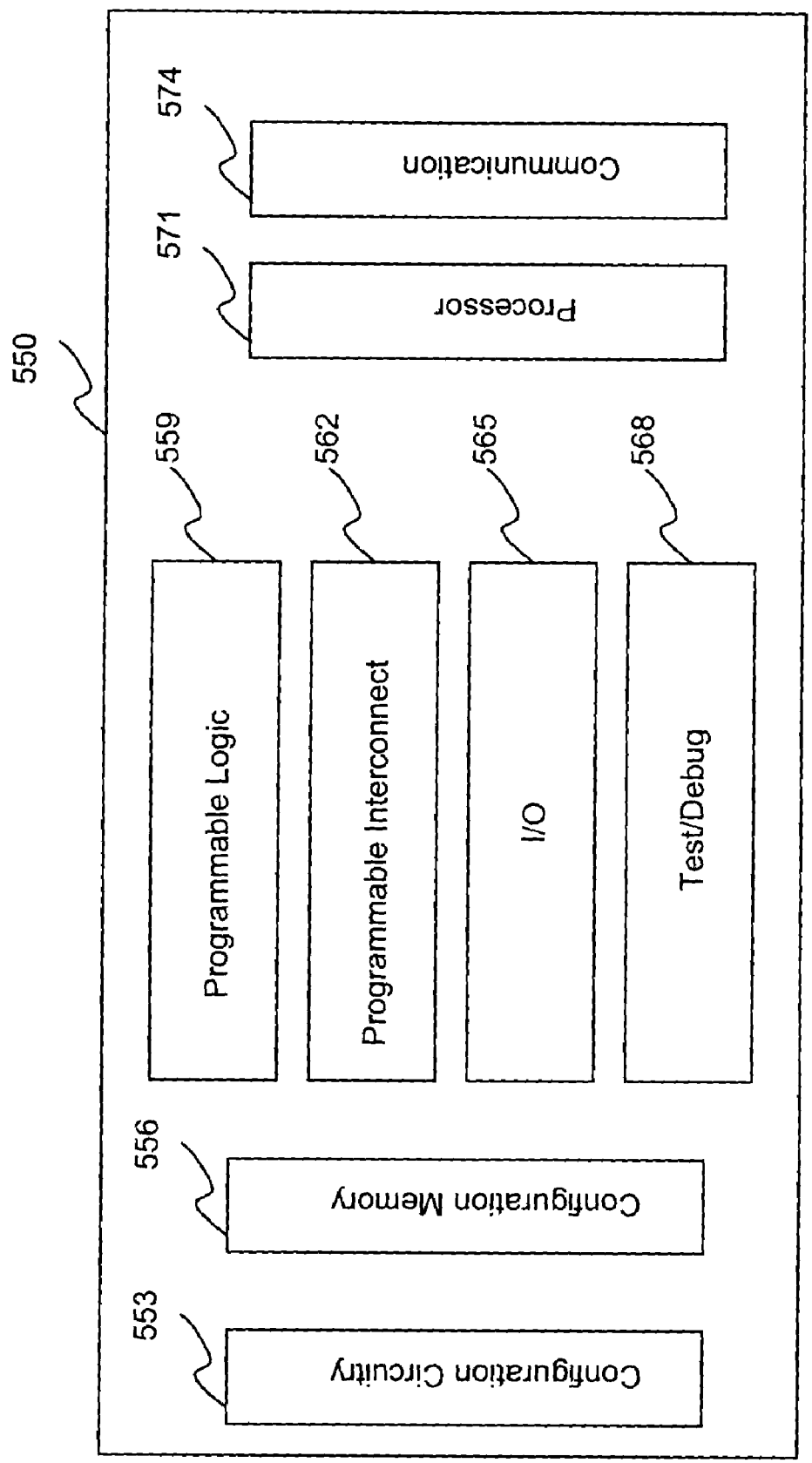
FIG. 14 illustrates a general block diagram of a PLD according to an illustrative embodiment of the invention.

FIG. 14 depicts a general block diagram of a PLD 550 according to an illustrative embodiment of the invention. PLD 550 includes configuration circuitry 553, configuration memory 556, programmable logic 559, programmable interconnect 562, and I/O circuitry 565. In addition, PLD 550 may include test/debug circuitry 568, one or more processors 571, and one or more communication circuitry 574.

Note that FIG. 14 shows a simplified block diagram of PLD 550. Thus, PLD 550 may include other blocks and circuitry, as persons of ordinary skill in the art understand. Examples of such circuitry include clock generation and distribution circuits, controllers (e.g., memory controllers), and the like.

Furthermore, similar to IC 503 described above, PLD 550 may include, analog circuitry, digital circuitry, and/or mixed-mode circuitry. One may implement or fabricate each type of circuitry using the same design and fabrication techniques described above generally and with respect to IC 503.

Programmable logic 559 includes blocks of configurable or programmable logic circuitry, such as look-up tables (LUTs), product-term logic, multiplexers, logic gates, registers, memory, and the like. Programmable interconnect 562 couples to programmable logic 559 and provides configurable interconnects (coupling mechanisms) between various blocks within programmable logic 559 and other circuitry within or outside PLD 550.

PLD configuration circuitry 553 uses configuration data (which it obtains from an external source, such as a storage device, a host, etc.) to program or configure the functionality of PLD 550. The configuration data determine the functionality of PLD 550 by programming programmable logic 559 and programmable interconnect 562, as persons skilled in the art with the benefit of the description of the invention understand.

I/O circuitry 565 may constitute a wide variety of I/O devices or circuits, as persons of ordinary skill in the art who have the benefit of the description of the invention understand. I/O circuitry 565 may couple to various parts of PLD 550, for example, programmable logic 559 and programmable interconnect 562. I/O circuitry 565 provides a mechanism and circuitry for various blocks within PLD 550 to communicate with external circuitry or devices.

Test/debug circuitry 568 facilitates the testing and troubleshooting of various blocks and circuits within PLD 550. Test/debug circuitry 568 may include a variety of blocks or circuits known to persons of ordinary skill in the art who have the benefit of the description of the invention. For example, test/debug circuitry 568 may include circuits for performing tests after PLD 550 powers up or resets, as desired. Test/debug circuitry 568 may also include coding and parity circuits, as desired.

As noted above, PLD 550 may include one or more processors 571. Processor 571 may couple to other blocks and circuits within PLD 550. Processor 571 may receive data and information from circuits within or external to PLD 550 and process the information in a wide variety of ways, as persons skilled in the art with the benefit of the description of the invention appreciate.

PLD 550 may also include one or more communication circuitry 574. Communication circuitry 574 may facilitate data and information exchange between various circuits within PLD 550 and circuits external to PLD 550, as persons of ordinary skill in the art who have the benefit of the description of the invention understand. As an example, communication circuitry 574 may provide various protocol functionality (e.g., Transmission Control Protocol/Internet Protocol (TCP/IP), User Datagram Protocol (UDP) etc.), as desired. As another example, communication circuitry 574 may include network (e.g., Ethernet, token ring, etc.) or bus interface circuitry, as desired.

One may implement or fabricate various blocks or circuits (or portions of blocks or circuits) within PLD 550 by using devices and circuits according to the invention, as desired.

Thus, one may implement various blocks or circuits using transistors with body contact(s) (e.g., transistors as shown in FIGS. 1–4), transistors with ESD protection (e.g., transistors as shown in FIGS. 5–10), or both. By taking advantage of each type of circuit's properties and design and performance specifications, one may design and produce PLDs with a wide variety of characteristics, cost, complexity, and end-use profiles, as desired.

For example, in a PLD 550 according to an exemplary embodiment of the invention, one may implement programmable logic 559 and programmable interconnect 562 using SOI circuitry that include transistors with body contact(s) according to the invention. One may implement I/O circuitry 565 at least in part using transistors with ESD protection according to the invention.

In a PLD 550 according to another exemplary embodiment of the invention, one may implement programmable logic 559, programmable interconnect 562, and processor(s) 571 using SOI circuitry that include transistors with body contact(s) according to the invention. One may implement I/O circuitry 565 at least in part using transistors with ESD protection according to the invention using SOI circuitry.

In a PLD 550 according to yet another exemplary embodiment of the invention, one may implement programmable logic 559, programmable interconnect 562, processor(s) 571, communication circuitry 574, configuration circuitry 553, configuration memory 556, and test/debug circuitry 568 SOI circuitry that include transistors with body contact(s) according to the invention. One may implement I/O circuitry 565 at least in part using transistors with ESD protection according to the invention.

Persons of ordinary skill in the art who have the benefit of the description of the invention appreciate that the embodiments described above constitute mere examples. Because of the flexibility of the inventive concepts, one may design and implement a wide variety of PLDs that include transistors according to the invention, as desired.

Note that the processing and fabrication techniques described here constitute merely exemplary techniques for practicing various embodiments according to the invention. One may use a variety of alternative techniques, depending on factors such as design and performance specifications for the circuitry within the IC, available processing and fabrication technology, and the like, as persons skilled in the art with the benefit of the description of the invention understand.

The processing steps and the resulting structures in exemplary embodiments described here relate to examples of currently available semiconductor fabrication and processing technologies and corresponding structures. In particular, one may use commonly available semiconductor fabrication processes and technology to fabricate circuitry according to the invention. Persons of ordinary skill in the art with the benefit of the description of the invention understand, however, that one may use variations of those processes, other processes, and corresponding structures that are currently available or become available in the future.

Moreover, one may use a wide variety of materials and process parameters (such as dopants, doping levels, thickness of various layers, etc.), as desired. The choice of materials and process parameters depends on the details of a desired or available processing technology, design and performance specifications of the desired circuitry and other circuitry within the integrated circuit, and the like, as persons skilled in the art with the benefit of the description of the invention understand. Furthermore, the description of exemplary embodiments omits routine processing, fabrication, and design techniques and processes that fall within the knowledge of persons of ordinary skill in the art who have the benefit of the description of the invention.

Referring to the figures, persons of ordinary skill in the art will note that the various blocks shown may depict mainly the conceptual functions and signal flow. The actual circuit implementation may or may not contain separately identifiable hardware for the various functional blocks. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of the invention understand.

Other modifications and alternative embodiments of the invention in addition to those described here will be apparent to persons of ordinary skill in the art who have the benefit of the description of the invention. Accordingly, this description teaches those skilled in the art the manner of carrying out the invention and are to be construed as illustrative only. The forms of the invention shown and described should be taken as the presently preferred embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

We claim:

1. A method of fabricating a silicon-on-insulator (SOI) transistor in an integrated circuit (IC), the method comprising:
    fabricating a first source region of the silicon-on-insulator (SOI) transistor;
    fabricating a second source region of the silicon-on-insulator (SOI) transistor;
    fabricating a body contact region, the body contact region electrically coupled to a body region of the silicon-on-insulator (SOI) transistor; and
    fabricating a gate configured to control a current flow between the first and second source regions and a drain region of the silicon-on-insulator (SOI) transistor;
    fabricating a first isolation region, the first isolation region disposed between the first source region and the body contact region; and
    fabricating a second isolation region, the second isolation region disposed between the second source region and the body contact region.

2. The method according to claim 1, further comprising fabricating at least one body contact coupled to the body contact region of the silicon-on-insulator (SOI) transistor.

3. The method according to claim 1, wherein fabricating the first and second isolation regions further comprises fabricating the first and second isolation regions from a dielectric material.

4. The method according to claim 3, wherein the dielectric material comprises silicon dioxide ($SiO_2$).

5. The method according to claim 3, wherein the dielectric materials comprises silicon carbide (SiC).

6. The method according to claim 3, further comprising fabricating the silicon-on-insulator (SOI) transistor in an analog circuit within the integrated circuit (IC).

7. The method according to claim 3, further comprising fabricating the silicon-on-insulator (SOI) transistor in a digital circuit within the integrated circuit (IC).

8. The method according to claim 3, further comprising fabricating the silicon-on-insulator (SOI) transistor in a mixed-mode circuit within the integrated circuit (IC).

9. The method according to claim 1, wherein fabricating each of the first and second isolation regions further comprises fabricating a shallow trench isolation (STI).

10. The method according to claim 9, wherein each shallow trench isolation (STI) comprises silicon dioxide ($SiO_2$).

11. The method according to claim 1, wherein fabricating the gate further comprises overlapping the gate and the body contact region.

12. The method according to claim 11, wherein fabricating the body contact region further comprises fabricating a region of doped semiconductor.

13. The method according to claim 1, wherein fabricating the body contact region further comprises fabricating a region of doped semiconductor.

14. A method of fabricating a silicon-on-insulator (SOI) transistor in an integrated circuit (IC), the method comprising:
fabricating a first source region of the silicon-on-insulator (SOI) transistor;
a second source region of the silicon-on-insulator (SOI) transistor;
fabricating a body contact region, the body contact region electrically coupled to a body region of the silicon-on-insulator (SOI) transistor;
fabricating a gate configured to control a current flow between the first and second source regions and a drain region of the silicon-on-insulator (SOI) transistor;
fabricating a first extension gate coupled to the gate, the first extension gate disposed adjacent to the body contact region and the first source region; and
fabricating a second extension gate coupled to the gate, the second extension gate disposed adjacent to the body contact region and the second source region.

15. The method according to claim 14, further comprising fabricating at least one body contact coupled to the body contact region of the silicon-on-insulator (SOI) transistor.

16. The method according to claim 14, further comprising fabricating a first semiconductor region between the first source region and the body contact region, wherein the first extension gate is fabricated above the first semiconductor region.

17. The method according to claim 16, further comprising disposing a second semiconductor region between the second source region and the body contact region, wherein the second extension gate is fabricated above the second semiconductor region.

18. The method according to claim 17, wherein the first and second semiconductor regions comprise silicon.

19. The method according to claim 17, wherein fabricating the gate further comprises overlapping the gate and the body contact region.

20. The method according to claim 19, wherein fabricating the body contact region further comprises fabricating a region of doped semiconductor.

21. The method according to claim 17, further comprising fabricating the silicon-on-insulator (SOI) transistor in an analog circuit within the integrated circuit (IC).

22. The method according to claim 17, further comprising fabricating the silicon-on-insulator (SOI) transistor in a digital circuit within the integrated circuit (IC).

23. The method according to claim 17, further comprising fabricating the silicon-on-insulator (SOI) transistor in a mixed-mode circuit within the integrated circuit (IC).

24. The method according to claim 14, wherein fabricating the gate further comprises overlapping the gate and the body contact region.

25. The method according to claim 14, wherein fabricating the body contact region further comprises fabricating a region of doped semiconductor.

* * * * *